United States Patent [19]

Fitzpatrick et al.

[11] Patent Number: 4,970,415

[45] Date of Patent: Nov. 13, 1990

[54] CIRCUIT FOR GENERATING REFERENCE VOLTAGES AND REFERENCE CURRENTS

[75] Inventors: Mark E. Fitzpatrick, San Jose; Michael G. France, Newark, both of Calif.

[73] Assignee: Gazelle Microcircuits, Inc., Santa Clara, Calif.

[21] Appl. No.: 381,629

[22] Filed: Jul. 18, 1989

[51] Int. Cl.[5] .................... H03K 3/013; H03K 17/16; G05F 1/56; H02H 3/22

[52] U.S. Cl. ................... 307/448; 307/296.1; 307/296.8; 307/310; 323/313; 361/56

[58] Field of Search ............... 307/448, 443, 350, 473, 307/475, 571, 581, 584, 296.1, 296.3, 298.8, 310, 270; 330/253; 323/312, 313; 361/56

[56] References Cited

U.S. PATENT DOCUMENTS

| | | | |
|---|---|---|---|
| 4,012,688 | 3/1977 | Blackburn et al. | 323/79 |
| 4,016,483 | 4/1977 | Rudin | 323/74 |
| 4,100,437 | 7/1978 | Hoff, Jr. | 307/296.8 |
| 4,451,744 | 5/1984 | Adam | 323/313 |
| 4,570,115 | 2/1986 | Misawa et al. | 323/313 |
| 4,609,833 | 9/1986 | Guterman | 307/296.1 |
| 4,629,972 | 12/1986 | Briner et al. | 323/314 |
| 4,645,998 | 2/1987 | Shinohara et al. | 323/313 |
| 4,686,451 | 8/1987 | Li et al. | 323/313 |
| 4,689,550 | 8/1987 | Ujihara et al. | 323/354 |
| 4,698,524 | 10/1987 | Plagens | 307/450 |
| 4,727,309 | 2/1988 | Vajdic et al. | 323/315 |
| 4,810,905 | 3/1989 | Graham et al. | 307/446 X |
| 4,812,683 | 3/1989 | Fitzpatrick et al. | 307/446 X |
| 4,897,565 | 1/1990 | Shimizu | 307/448 |

Primary Examiner—Stanley D. Miller
Assistant Examiner—David R. Bertelson
Attorney, Agent, or Firm—Skjerven, Morrill, MacPherson, Franklin & Friel

[57] ABSTRACT

In one embodiment, a semiconductor device which generates a substantially constant reference voltage over a broad temperature range upon application of a power supply voltage thereto, wherein a current substantially inversely proportional to the value of a load resistor is drawn through the resistor to generate a substantially constant voltage across the resistor. The current through the resistor is the sum of a first current and a second current. The first current is determined by the absolute value of the threshold voltage of a depletion mode FET (DFET) in conjunction with an associated first resistor. The second current is determined by the threshold voltage of an enhancement mode FET (EFET) in conjunction with an associated second resistor. As the temperature of the device changes the first and second currents will change in opposite directions with the sum being changed inversely proportional to the change in resistance with temperature of the load resistor. As a result, the voltage across the load resistor will remain substantially constant.

39 Claims, 5 Drawing Sheets

CIRCUIT FOR GENERATING REFERENCE VOLTAGES AND REFERENCE CURRENTS

FIELD OF THE INVENTION

This invention relates to electronic circuitry for generating a substantially constant reference voltage and a substantially constant reference current, and more particularly, to such circuitry which may be implemented in gallium arsenide technology.

BACKGROUND OF THE INVENTION

A typical circuit for implementation in semiconductor technology may require a plurality of different reference voltages to be applied at appropriate places for proper operation thereof. As an example, the input buffer circuit shown in FIG. 1 may require a reference voltage $V_{REF1}$ applied to the gates of transistors 20, 21, respectively, so as to provide a substantially constant voltage swing across the resistors $R_{L1}$, $R_{L2}$, during operation of the differential pair of transistors 22, 24 and the differential pair of transistors 26, 28. Furthermore a reference voltage $V_{REF2}$ may be needed which should have the capability of insuring that a constant current is provided through each of the respective resistors $R_C$, operatively associated with the differential pair of transistors 26, 28.

Figure 1:
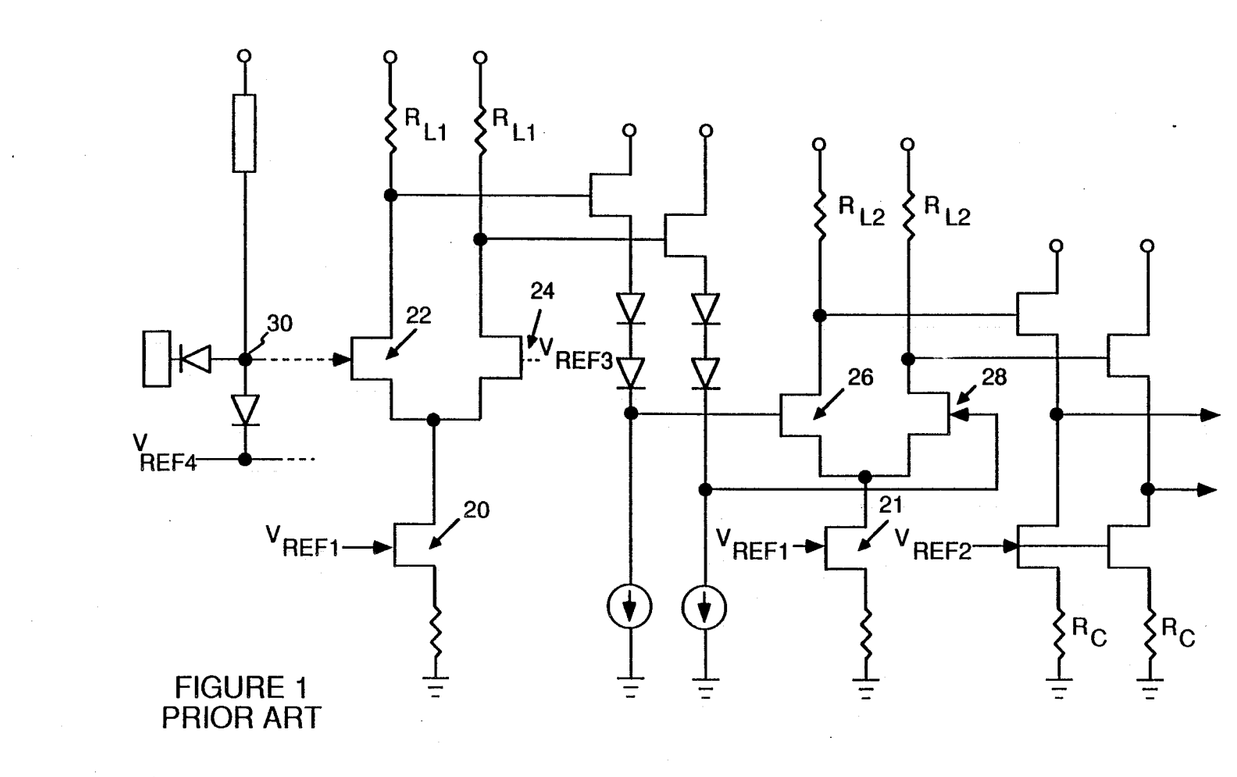
FIG. 1 is a schematic diagram of a typical circuit incorporating differential pairs of transistors to which reference voltages generated using the present invention may be applied.

Additionally, a reference voltage $V_{REF3}$ is useful in the situation where the transistors 22, 24 make up single-ended input to a differential pair, i.e., the input to the gate of transistor 22 is varied above and below the input signal $V_{REF3}$. Also, in certain situations, such as relating to the use of reference voltage $V_{REF4}$, the reference voltage should be capable of sinking a large and varying current, due to the fact that it may be operatively coupled to a large number of differential pair transistors (only one of which is shown at 22, 24), to prevent the voltage on node 30 from rising more than a diode drop above $V_{REF4}$.

Heretofore, attempts have been made to provide circuits which generate such reference voltages and currents in a way so that the reference voltages and currents are not significantly affected by temperature or power supply voltage fluctuations in order to meet the needs described. Such circuits have limitations in achieving these goals, and the difficulty in achieving such goals is increased when there is an attempt to implement the circuits in gallium arsenide technology. For example, in a reference voltage generator circuit using gallium arsenide technology, since threshold voltages for GaAs FETs are difficult to control, any reference voltage affected by the particular value of an FET threshold voltage will be difficult to control.

SUMMARY OF THE INVENTION

It is accordingly an object of this invention to overcome the problems cited above by providing circuitry capable of generating reference voltages and currents in a highly efficient manner, regardless of the technology in which the circuits are implemented and despite variations in threshold voltages of FET devices used within the circuitry. The circuit is also designed to provide a constant reference voltage or current over a relatively wide range of temperatures, e.g., −55 to 125° C. Specifically, the circuit is designed to provide a constant voltage or current for all temperatures within, and well outside of, the commonly specified standard ranges for integrated circuit operation. Examples of these standard ranges are: ECL, 0°–75° C.; CMOS, 0°–70° C. (commercial), −55°–125° C. (military); and TTL, 0°–70° C. (commercial), −55°–125° C. (military).

Broadly stated, in one embodiment, the invention is a semiconductor device, which may be implemented in gallium arsenide technology, which generates a substantially constant reference voltage over at least the temperature ranges described above upon application of a power supply voltage thereto, wherein a current substantially inversely proportional to the value of a load resistor is drawn through the resistor to generate a substantially constant voltage across the resistor, and wherein the current through the resistor is the sum of a first current and a second current.

The first current is determined by the absolute value of the negative threshold voltage of a depletion mode FET (DFET) in conjunction with an associated first resistor. The second current is determined by the threshold voltage of an enhancement mode FET (EFET) in conjunction with an associated second resistor. (This EFET may be a DFET as long as its threshold voltage is higher than the DFET previously described.)

As the temperature of the device changes, the absolute value of the threshold voltage of the DFET changes in a first direction while the threshold voltage of the EFET changes in an equal but opposite direction. If the first resistor and second resistor are made substantially identical, the resistances will change equally with a change in temperature. Hence, as the first current changes in a first direction with the change in temperature, the second current will change in an opposite direction, with the sum of the two currents through the load resistor changing inversely proportional to the change in the value of the load resistor. Consequently, the voltage across the load resistor will remain substantially constant.

The reference circuit can be made relatively immune to variances in threshold voltages by incorporating additional EFETs and DFETs in the circuit whose operating characteristics are chosen so as to offset all effects of the actual values of threshold voltages of the FETs used in the reference voltage circuit.

Thus, the reference circuit is virtually immune to temperature changes and process variations.

By changing the relative values of the first and second resistors in the embodiment above, the output voltage of the device can be made to vary in a selected manner with temperature. The voltage can then be applied to a gate of an FET controlling current through a third resistor so as to nullify any changes in the performance characteristics of the FET and changes in the resistance value of the third resistance with temperature. In this way a constant current generator is constructed.

DETAILED DESCRIPTION

The preferred embodiment of the invention makes use of one or more depletion mode field effect transistors (DFET) and one or more enhancement mode field effect transistors (EFET). To better understand the advantages of the hereinbelow described preferred embodiments of the invention, reference is made to FIGS. 2 and 3, which show voltage vs. current graphs for a DFET and an EFET, respectively, given various gate-source voltages ($V_{GS}$). In a DFET, the channel is only partially depleted at a $V_{GS}$ of 0 volts. A more positive $V_{GS}$ lessens the depletion in the channel and allows more current to flow between a source and a drain. A more negative $V_{GS}$ increases the depletion in the channel and restricts the flow of current between the source and the drain. A $V_{GS}$ which is sufficiently negative so that the channel is effectively pinched off and virtually no current flows between the source and the drain is the threshold voltage ($V_{TH}$), also called the pinch-off voltage. Typically, as the temperature of the DFET increases, an increasingly negative $V_{GS}$ is needed to achieve pinch-off of the channel.

Figure 3:
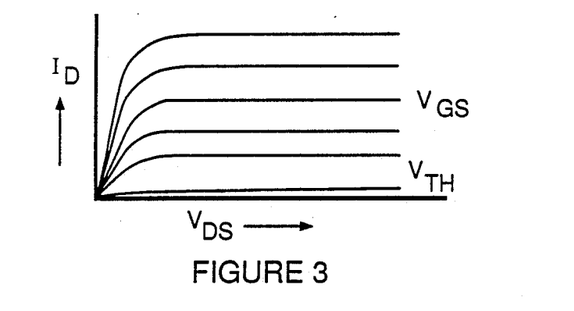
FIG. 3 is a voltage vs. current graph for a typical enhancement mode FET.

FIG. 3 shows the voltage vs. current for a typical EFET given various gate-source voltages $V_{GS}$. As seen in FIG. 3, at a certain $V_{GS}$, which is typically a positive voltage, the channel region of the EFET is virtually completely depleted of charge carriers and almost no current flows between the source and drain. This $V_{GS}$ value is the threshold voltage $V_{TH}$. A more positive value of $V_{GS}$ is necessary in order to reduce the depletion within the channel to allow current to flow between the source and drain.

In an EFET, theoretically, $V_{TH}$ is a positive value. However, in gallium arsenide technology, threshold voltages for EFETs may vary from wafer to wafer and, in some cases, may even be slightly negative.

Typically, in an EFET, an increase in temperature causes the threshold voltage $V_{TH}$ to be lowered, perhaps even to a negative voltage.

Figure 2:
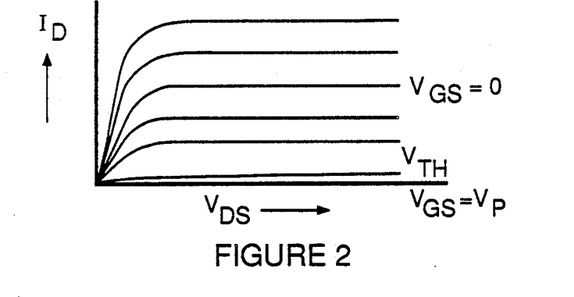
FIG. 2 is a voltage vs. current graph for a typical depletion mode FET.

FIGS. 2 and 3 assume an N channel device is being used, such as a gallium arsenide N channel DFET and EFET; however, N channel or P channel MOSFETS and JFETs, implemented in silicon or any semiconductor, can also be used in this invention while still achieving the stated advantages of the invention.

Figure 4:
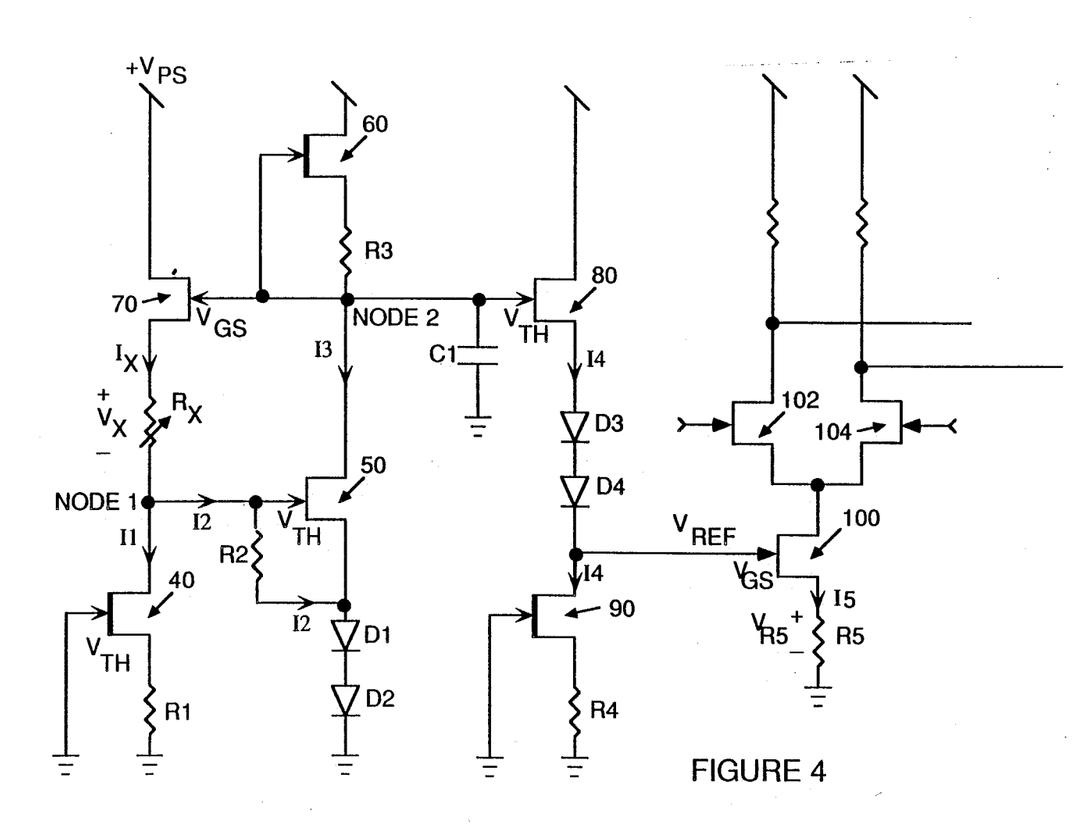
FIG. 4 is a schematic diagram of a preferred embodiment of a constant voltage reference circuit.

FIG. 4 is a preferred embodiment of a constant voltage reference circuit in accordance with the invention, which supplies a reference voltage $V_{REF}$ to the gate of EFET 100 to provide a substantially constant voltage $V_{R5}$ across resistor R5 to control current through a differential pair of transistors 102, 104. In FIG. 4, power supply voltage $V_{PS}$ is applied to the various power supply terminals as shown.

It is an object of the circuit of FIG. 4 to use the temperature coefficients of the various electrical components to offset one another to produce an effective zero temperature coefficient for the voltage $V_{R5}$ across resistor R5. It is also an object of the circuit of FIG. 4 to have the value of the voltage $V_{R5}$ across resistor R5 be independent of the effects of variations in threshold voltages of the various FET devices and variations in resistor values by incorporating components in the circuit which offset any variations in the actual values of threshold voltages and resistors. Thus, the circuit of FIG. 4 is effectively insensitive to temperature and fabrication process variations. Circuitry is also included to make the circuit insensitive to power supply fluctuations as well.

To accomplish these objects a current $I_X$ is made to flow through load resistor $R_X$, thus creating a constant voltage $V_X$ across resistor $R_X$. A first current I1 is drawn through DFET 40, having its drain coupled to a first terminal of resistor $R_X$ at node 1, and a second current I2 is drawn through resistor R2, having a terminal also coupled to node 1, wherein the sum of currents I1 and I2 equals the current $I_X$ drawn through resistor $R_X$.

In a preferred embodiment, resistor $R_X$ is a variable resistor, whose value is selected by laser trimming, to allow precise adjustment of the nominal value of the voltage $V_X$ across resistor $R_X$.

Current I1 is generated by connecting the gate of DFET 40 directly to ground and connecting the source of DFET 40 through resistor R1 to ground. In this configuration, current I1 through DFET 40 will cause a voltage drop across resistor R1, causing the $V_{GS}$ of DFET 40 to become more negative with an increasing current I1 through DFET 40. Hence, an increasing current I1 through DFET 40 causes an increased depletion in the channel of DFET 40 due to the more negative $V_{GS}$, and an equilibrium state arises where current I1 is constant for a constant temperature. By fabricating DFET 40 so as to have a low current density with a drain current of I1, the $V_{GS}$ is, therefore, maintained close to, but slightly above, the threshold voltage $V_{THD}$ of DFET 40. Hence, since the voltage at the source of DFET 40 is the absolute value of $V_{THD}$, since the gate is grounded, current I1 through DFET 40 is equivalent to $|V_{THD}|/R1$.

The current I2 through resistor R2 is determined by the threshold voltage $V_{THE}$ of EFET 50. Resistor R2 is connected between the gate and source of EFET 50, and the gate of EFET 50 is coupled to the first terminal of resistor $R_X$ at node 1. The source of EFET 50 is coupled to ground through diodes D1 and D2. Since negligible current flows into the gate of EFET 50, the $V_{GS}$ of EFET 50 is effectively I2 x R2.

In order to control the magnitude of current I2 so that I2 is made dependent upon the threshold voltage $V_{THE}$ of EFET 50, EFET 50 is fabricated so as to have a low current density with a drain current of I3, wherein I3 is provided by DFET 60 and resistor R3, acting together as a load device, coupled between the drain of EFET 50 (at node 2) and power supply voltage $V_{PS}$. At this low current density, the $V_{GS}$ of EFET 50 is maintained close to, but slightly above, its threshold voltage $V_{THE}$. Hence, current I2 will be determined by $V_{THE}/R2$.

The magnitude of current I3 and the $V_{GS}$ of EFET 50 are at equilibrium. To illustrate, any increase in current I2 through resistor R2, causing an increased $V_{GS}$ of EFET 50, will cause an increase in current I3 through EFET 50. This increase in current I3 will cause the voltage at node 2 to lower, resulting in the voltage across resistor R2, and hence the $V_{GS}$ of EFET 50, to decrease, due to the feedback path through EFET 70 and $R_X$. The decrease in the $V_{GS}$ of EFET 50 counteracts the increase in current I3, and equilibrium is achieved. A similar but reverse effect occurs for a lowering in current I2, causing a reduction in the $V_{GS}$ of EFET 50.

To prevent oscillations at node 2, filter capacitor C1 is coupled between node 2 and ground.

The drain of EFET 50 is coupled to the gate of EFET 70. The drain of EFET 70 is coupled to the power supply voltage $V_{PS}$, while the source of EFET 70 is coupled to resistor $R_X$. Current $I_X$ through EFET 70 causes a certain $V_{GS}$ across the gate-source terminals of EFET 70. As will be explained later, this $V_{GS}$ of EFET 70 is utilized to offset the $V_{GS}$ of EFET 100. EFET 70 may be eliminated, and current $I_X$ will still be generated in accordance with equation 1 below, by merely shorting node 2 to the top terminal of resistor $R_X$.

Since current $I_X$ is dependent solely upon $V_{THD}$, $V_{THE}$, R1, and R2, the current $I_X$ through resistor $R_X$ is given by the equation, $$|V_{THD}|/R1 + V_{THE}/R2. \qquad (\text{eg. 1})$$

The source of EFET 50 is coupled to ground via diodes D1 and D2, in this case Schottky diodes implemented in GaAs technology, in order to ensure that the voltage at the drain of DFET 40 is sufficiently high for the proper operation of DFET 40. This voltage drop across the two diodes D1 and D2 in series will be referred to as $2V_d$.

As seen by the above description, the voltage at the drain of EFET 50 (node 2) is kept at an equilibrium state and is determined by the values of the various threshold voltages and resistance values of the heretofore described components.

Node 2 is coupled to the gate of EFET 80, whose drain is coupled to the power supply voltage $V_{PS}$ and whose source is coupled to ground through series diodes D3 and D4, and through DFET 90 and resistor R4. The voltage at node 2 is calculated as follows:

$$2V_d(\text{from D1 and D2}) + V_{THE}(\text{EFET 50}) + V_X(\text{across } R_X) + V_{GS}(\text{EFET 70}). \qquad (\text{eq. 2})$$

This equilibrium voltage applied to the gate of EFET 80 creates a $V_{GS}$ across the gate-source of EFET 80, and current I4 is caused to flow through EFET 80. Preferably, EFET 80 is fabricated to have a similar current density (current/width of FET) as EFET 50 so that these two FETs will have similar operating voltages. Current I4 through EFET 80 flows to ground through series diodes D3 and D4, which are fabricated to have similar current densities as diodes D1 and D2, and through DFET 90 and resistor R4, which are fabricated so that DFET 90 has a similar current density as DFET 60 when operated with resistor R3. The voltage at the source of EFET 80 is reduced by two diode drops by diodes D3 and D4 and applied to he gate of EFET 100, wherein EFET 100 is fabricated to have a similar current density as EFET 70. Hence, at equilibrium, the $V_{GS}$ of EFETs 50 and 80 will be similar; the $V_{GS}$ of DFETs 60 and 90 will be similar; the $V_{GS}$ of EFETs 70 and 100 will be similar; and the voltage drops across diodes D1 and D2 and the drops across diodes D3 and D4 will be similar.

The voltage applied to the gate of EFET 100 is reference voltage $V_{REF}$. In an application, the reference voltage $V_{REF}$ applied to the gate of EFET 100 would be applied to numerous other FETs for controlling current through their associated differential pair of transistors. This reference voltage $V_{REF}$ applied to the gate of EFET 100 will cause a certain current to flow through EFET 100 and resistor R5, coupled between the source of EFET 100 and ground.

Due to the various voltage drops across the various FETs and diodes offsetting one another, the voltage $V_{R5}$ across resistor R5 must be $V_X$, which is the voltage across $R_X$. Specifically, due to the offsetting $V_{GS}$ voltages, any fabrication or temperature related variations in the $V_{GS}$ of EFETs 70 and 50 will be offset by a substantially identical change in the $V_{GS}$ of EFETs 100 and 80, respectively. Further, any change in the diode drops of D1 and D2 will be offset by substantially identical changes in the diode drops of D3 and D4. Still further, any change in the characteristics of DFET 60 and R3 will be offset by substantially identical changes in DFET 90 and R4, assuming DFETs 60 and 90 have similar current densities.

As seen, the configuration of FIG. 4 causes the effects of variations in the individual components to offset one another thus enabling the voltage $V_{R5}$ across resistor R5 to be independent of any fabrication or temperature variations.

Further, since the current through EFET 70, DFET 60, and EFET 80 is negligibly affected by changes in power supply voltage $V_{PS}$, the circuit of FIG. 4 is virtually insensitive to power supply voltage fluctuations. This desirable feature is due to the current through a FET being virtually independent of the drain-source voltage across the FET when it is operating in its saturated region.

The effect of the various components on voltage $V_{R5}$ due to a change in temperature will now be discussed in more detail. Each FET having a similar current density as another FET, or each resistor having a similar value as another resistor, will have similar reactions to changes in temperature and, in the circuit of FIG. 4, these changes offset each other so that voltage $V_{R5}$ remains constant despite changes in temperature.

With respect to the current $I_X$ through $R_X$, where $I_X$ equals $|V_{THD}|/R1 + V_{THE}/R2$, if the temperature of the circuit increases, the absolute value of the threshold voltage $V_{THD}$ of DFET 40 increases while the resistance of resistor R1 also increases. Thus, current I1, determined by $|V_{THD}| \times$ R1, changes in a certain direction. At the same time, the threshold voltage $V_{THE}$ of EFET 50 is lowered with an increasing temperature, and resistance R2 increases with the increase in temperature. If resistors R1 and R2 are made the same value, and since $|V_{THD}| + V_{THE}$ is inherently a constant, assuming $V_{THD}$ and $V_{THE}$ have similar temperature coefficients, then a rising $|V_{THD}|$ due to an increase in temperature will be offset by a falling $V_{THE}$, and the current $I_X$ through resistor $R_X$ will change inversely proportional to the change in the value of resistors R1, R2 and $R_X$.

Resistance $R_X$ is chosen to achieve a desired voltage across, and current through, resistor R5 for an optimum speed vs. power characteristic of the logic circuits coupled to the constant voltage reference circuit of FIG. 4.

As previously discussed, the various voltage drops across the FETs, resistors, and diodes in the circuit of FIG. 4 are all offset with complement components and the net change in voltage $V_{R5}$ with temperature is effectively zero. Thus, the circuit of FIG. 4 may be subjected to wide ranges of temperature, e.g., $-55°$ C. to $125°$ C., without significantly changing the value of voltage $V_{R5}$.

As is readily apparent, the various EFETs may instead be DFETs, since the only difference will be the magnitude of the various $V_{GS}$ voltages. The only requirement is that the threshold voltage of FET 50 be more positive than the $V_{THD}$ of DFET 40. Although the circuit of FIG. 4 uses N channel devices, P channel EFETs and DFETs may be used, given appropriate consideration to the reversal of channel polarities. Further, the circuit of FIG. 4 can also be easily constructed by one of ordinary skill in the art using N channel or P channel MOSFETs or JFETs.

Although it is preferred to fabricate FETs 40, 50, and 80 in FIG. 4 to operate at low current densities, and, hence, near their threshold voltages, FETs 40, 50, and 80 may be fabricated to operate at higher gate-source voltages, producing a less desirable circuit, but still achieving the advantages heretofore described. Operation of the FETs near their threshold voltages is preferred, since variances in gate-source voltages closer to the threshold voltages produce smaller variances in current through the FET than variances in larger gate-source voltages. Thus, the desired value of the various currents in the circuit of FIG. 4 may be more easily obtained by operating FETs 40, 50, and 80 near their threshold voltages.

Figure 5:
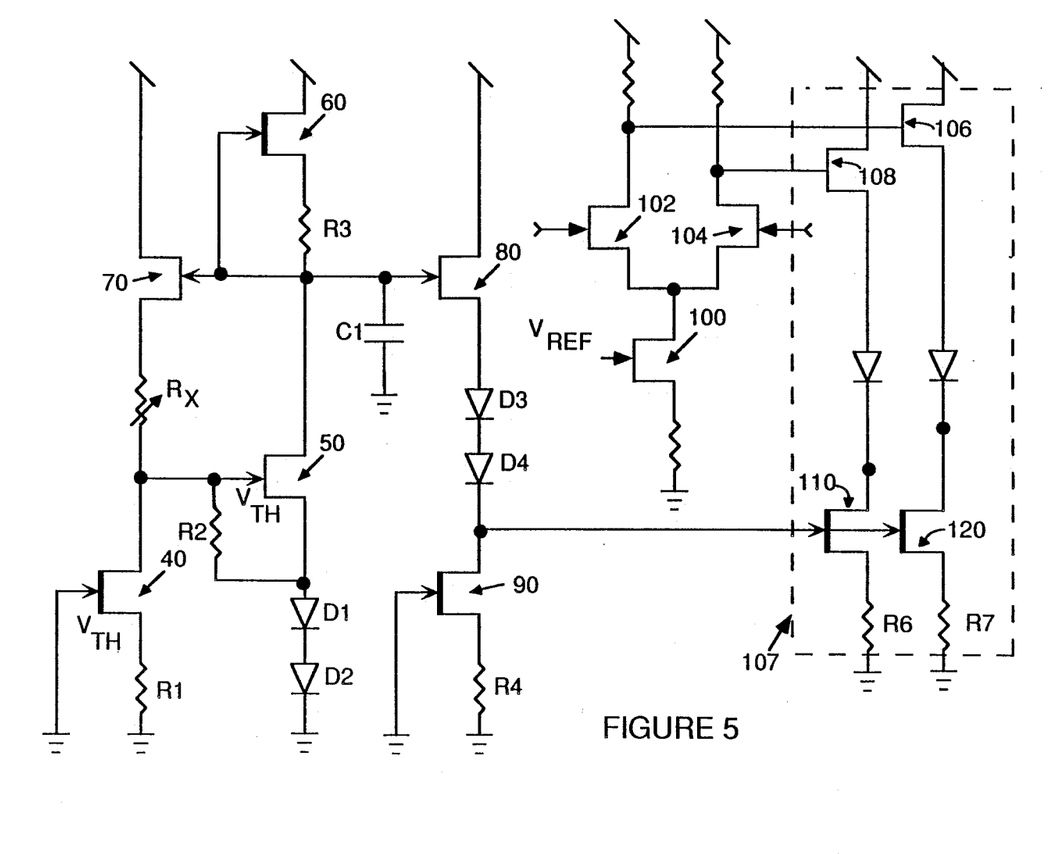
FIG. 5 is a schematic diagram of a preferred embodiment of a constant current reference circuit.

The techniques used in the constant voltage reference circuit of FIG. 4 can be also applied to the constant current reference circuit of FIG. 5. As seen by FIG. 4, although voltage $V_{R5}$ and $V_X$ remain constant despite variations in temperature, the value of resistor R5 may change with temperature. This will result in a change in current through resistor R5. To achieve a constant current through a resistor where current through the resistor is controlled by an EFET whose gate is coupled to $V_{REF}$, the value of voltage $V_{R5}$ must be allowed to change in a selected manner to offset any change in the value of the resistor due to temperature variations.

In FIG. 5, a reference voltage $V_{REF}$, such as that generated in the constant voltage reference circuit of FIG. 4, is applied to the gate of EFET 100 to control current through differential transistor pair 102, 104. The outputs of transistors 102, 104 are coupled to EFETs 106, 108 of level shifter 107, which converts the respective outputs of transistors 102, 104 to corresponding higher power outputs or different voltage levels.

A temperature sensitive voltage $V_T$ is applied to the gates of EFETs 110 and 120 of level shifter 107 which varies in a predetermined way with temperature so that the changes in the values of resistors R6 and R7 connecting the sources of EFET 110 and EFET 120, respectively, to ground are effectively offset by the change in voltage $V_T$ with temperature. Thus, although the resistances of R6 and R7 increase with temperature, trying to reduce the current through EFETs 110 and 120, the voltage $V_T$ also increases with temperature so that a constant current flows through EFETs 110 and 120 and resistors R6 and R7. This results in a voltage across resistors R6 and R7 which increases with temperature proportional to the resistance of R6 and R7.

This voltage $V_T$ applied to the gates of EFETs 110 and 120 is adjusted by means of selecting the proper relative values of resistors R1 and R2, performing the same function and connected identically as R1 and R2 in the constant voltage reference circuit of FIG. 4. The remainder of the circuit of FIG. 5 is identical to that of FIG. 4.

To achieve an increasing voltage applied to the gates of EFETs 110 and 120, the resistance of resistor R2 is made greater than the resistor R1 to provide the desired rate of increasing voltage $V_T$ with temperature. The ratio of R1 and R2 will not vary with temperature so the voltage $V_T$ will increase at a constant rate.

Since, as previously discussed, the current through resistor $R_X$ equals $|V_{THD}|/R1 + V_{THE}/R2$, if R2 is made larger than R1, as the temperature rises and $V_{THE}$ falls while the absolute value of $V_{THD}$ rises, the current $I_X$ flowing through resistor $R_X$ will be higher than in the constant voltage circuit of FIG. 4 and, therefore, the voltage $V_X$ across resistor $R_X$ will increase. This increase in voltage across resistor $R_X$ will result in an increase in voltage applied to the gates of EFETs 110 and 120. When the ratio of R2 to R1 is adjusted such that the temperature coefficient of the voltages across $R_X$, R6, and R7 matches that of the resistor values themselves, currents through R6 and R7 will be constant despite changes in temperature.

Resistor $R_X$ would be chosen to provide the initial desired voltage across, and current through, resistors R6 and R7 for optimum speed vs. power performance of the circuits coupled to level shifter 107.

If desired, the relative values of resistors R1 and R2 may be chosen to provide a voltage $V_T$ having any desired temperature coefficient.

For selection of arbitrary temperature coefficient (TC) of $V_X$ given arbitrary TC's for $V_{THE}$ and $V_{THD}$ (i.e., in case they are not equal as previous analyses have assumed):

Given a linear variation in $V_{THD}$ and $V_{THE}$ over temperature, $$V_{THD} = V_{THD0} + K_1(T - T_0) \quad K_1 = TC \text{ of } V_{THD} \quad \text{(eq. 3)}$$

$$V_{THE} = V_{THE0} + K_2(T - T_0) \quad K_2 = TC \text{ of } V_{THE} \quad \text{(eq. 4)}$$

In our circuit, $$I_1 \approx \frac{|V_{THD}|}{R1} \text{ and } I_2 \approx \frac{V_{THE}}{R2}, \quad \text{(eq. 5)}$$

since we assume the $V_{GS}$ of DFET 40 and EFET 50 are close to the threshold values.

Therefore, $$I_1 + I_2 = \frac{|V_{THD0} + K_1(T - T_0)|}{R1} + \frac{V_{THE0} + K_2(T - T_0)}{R2}. \quad \text{(eq. 6)}$$

Since $V_X = R_X(I_1 + I_2)$, (eq. 7)

then $$V_X = \frac{R_X}{R1} |V_{THD0} + K_1(T - T_0)| + \frac{R_X}{R2} [V_{THE0} + K_2(T - T_0)]. \quad \text{(eq. 8)}$$

If we make R1, R2, and $R_X$ out of the same type of resistive material, their values will all track each other over temperature and the ratios $R_X/R1$ and $R_X/R2$ will not vary over temperature.

$$\text{Thus, } \frac{dV_X}{dT} = \frac{R_X}{R1} |K_1| + \frac{R_X}{R2} K_2. \quad \text{(eq. 9)}$$

In our preferred application, $K_1$ and $K_2$ are negative (i.e., threshold voltages become lower with increasing temperature) so equation 9 involves the sum of a positive and a negative number. It should be apparent that any desired value of $dV_X/dT$ (including zero) can be obtained for arbitrary values of $K_1$ and $K_2$ (even if they are different) through appropriate selection of $R_X/R1$ and $R_X/R2$ ratios.

Circuit simulation of the constant voltage reference circuit of FIG. 4 has shown that the voltage across resistor R5 will vary by no more than ±0.58% from its nominal value for power supply variations of 4.5–5.5 volts. Additionally, the voltage across resistor R5 will vary by no more than ±0.30% for temperature variations of 0° C. to 75° C., and will vary by no more than ±0.66% for temperature variations of −55° C. to +125° C. For a nominal 1 volt reference output, the variation in reference voltage over 0° C. to 75° C. has been shown to be 5 mV total or only 0.04 mV/°C.

Circuit simulation of the constant current reference of FIG. 5 has shown that the current through resistors R6 and R7 will vary by no more than ±0.47% from its nominal value for power supply variations of 4.5–5.5 volts. Additionally, the current through resistors R6 and R7 will vary by no more than ±1.30% for temperature variations of 0° C. to 75° C., and will vary by no more than ±3.28% for temperature variations of −55° C. to +125° C.

Figure 6:
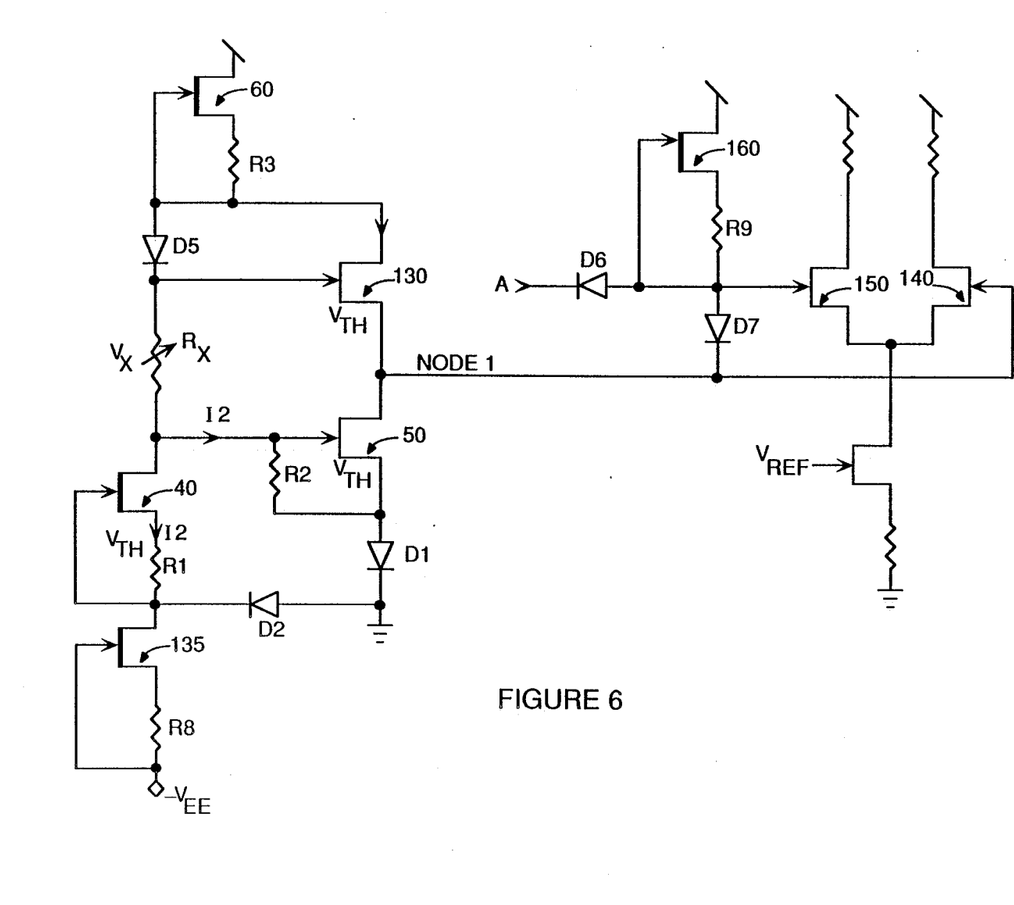
FIG. 6 is a schematic diagram of a preferred embodiment of an input threshold reference circuit.

FIG. 6 shows an input threshold reference circuit which applies a constant reference voltage to an input of transistor 140 of a differential pair of transistors. In FIG. 6, the portion of the circuit comprising DFET 40, EFET 50, resistors R1 and R2, and diodes D1 and D2 operates similarly to the corresponding circuitry of FIG. 4, except that the anode of diode D2 is now connected to ground and its cathode, as well as the gate of DFET 40, is biased at a negative voltage ($-V_{EE}$) through a load device comprising DFET 135 and resistor R8. This configuration allows the voltage at node 1 to operate at a lower value.

EFET 130, coupled between EFET 50 and a load device comprising DFET 60 and resistor R3, acts to offset the $V_{GS}$ of EFET 50. Both EFET 50 and EFET 130 are fabricated to operate at a similar low current density such that both devices operate near their threshold voltage. An equilibrium state is achieved where current through EFETs 50 and 130 causes current I2 to equal $V_{THE}/R2$.

Thus, as explained with respect to FIG. 4, if R1 and R2 are made to have identical values, any change in the values of these components and the threshold voltages of EFET 50 and DFET 40, due to a change in temperature, will offset one another and a constant voltage $V_X$ will be generated across resistor $R_X$ despite changes in temperature.

DFET 135, having its source coupled to negative voltage $V_{EE}$ through resistor R8 and its gate coupled to $V_{EE}$, is used to bias the voltage at the bottom terminal of resistor R1 to one diode drop below ground for the proper operation of DFET 40.

Diode D5, connected between the gate and drain of EFET 130, is merely used to ensure that the gate voltage applied to EFET 130 can be pulled sufficiently below the drain voltage to adequately ensure that EFET 130 operates in its saturated region in case EFET 130 has a slightly negative threshold voltage.

Since EFET 130 and EFET 50 have identical low current densities, causing both to operate near their threshold voltages, the voltage at the drain of EFET 50 (node 1) will be:

$$V_{D1}(\text{across D1}) + V_{GS}(\text{EFET } 50) + V_X - V_{GS}(\text{EFET } 130). \quad \text{(eq. 10)}$$

Since the $V_{GS}$ of EFET 50 is close to the $V_{GS}$ of EFET 130, the voltage at node 1 is substantially equal to:

$$V_{D1} + V_X. \quad \text{(eq. 11)}$$

The reference voltage at node 1 is applied to EFET 140 of the differential pair of transistors 140, 150 as a reference voltage. The input voltage applied to terminal A will be raised by diode D6 and applied to the gate of EFET 150 of the differential pair, and thus will effectively be compared against $V_X$.

Diode D7 serves to limit the voltage at the gate of EFET 150 to one diode drop above the gate of EFET 140.

DFET 160 in conjunction with resistor R9 serves as a load device for the input structure. EFET 50 must be large enough to sink current generated by, typically, a plurality of load devices identical to DFET 160 and resistor R9.

As seen, the circuit of FIG. 6 generates a reference voltage which is not affected by temperature changes or process variations in a manner similar to that of FIG. 4.

The concepts used in the embodiments of FIGS. 4, 5, and 6 may be used in various other types of circuits where it is desired that the threshold voltages and pinch-off voltages of FETs are not to affect a resulting output of the device incorporating the FETs. The concepts described herein are also applicable to a variety of circuits wherein a voltage or current is to be generated which is to be varied in a selected manner with changes in temperature.

Other embodiments and applications of the invention will become obvious to those of ordinary skill in the art. However, the invention is intended to encompass any modification of the invention which uses the various broad concepts taught with respect to the preferred embodiments.

What is claimed is:

1. A circuit for generating a voltage selectively affected by temperature across a first load comprising:
   a first current drawing device coupled to a first terminal of said first load for drawing a first current through said first load, said first current being related to a threshold voltage of a first transistor;
   a second current drawing device coupled to said first terminal of said first load for drawing a second current through said first load, said second current being related to a threshold voltage of a second transistor;
   said first current being changed by a first magnitude in a first direction with a change in temperature, said second current being changed by a second magnitude in a direction opposite said first direction with said change in temperature.

2. The circuit of claim 1 wherein said first current is also related to a first resistance and said second current is related to a second resistance, wherein said first and second resistances are selected so that a sum of said first and second currents through said first load changes in a desired manner with temperature.

3. The circuit of claim 2 wherein said first load is a first resistive load.

4. The circuit of claim 3 wherein said first and second resistances are made equal so that said sum of said first and second currents change with temperature inversely proportional to a change in resistance of said first resistive load with said change in temperature, resulting in said sum of said first and second currents through said first resistive load generating a voltage across said first resistive load which is substantially constant with respect to temperature.

5. The circuit of claim 3 wherein said first current drawing device comprises a first depletion mode field effect transistor having a gate coupled to a first potential and a source coupled to said first potential through said first resistance, and wherein a drain of said first depletion mode field effect transistor is connected to a first terminal of said first resistive load.

6. The circuit of claim 5 wherein said second current drawing device comprises a second field effect transistor having its gate coupled to said first terminal of said first resistive load and also having its gate coupled to its source via said second resistance, wherein current through said second field effect transistor is controlled via a feedback means, coupled between a drain of said second field effect transistor and a second terminal of said first resistive load, which fixes a gate-source voltage across said second resistance which is dependent upon a threshold voltage of said second field effect transistor.

7. The circuit of claim 6 wherein said source of said second field effect transistor is connected to said first potential via a first level shifting means.

8. A circuit for generating a constant voltage reference signal over a range of temperatures comprising:
a first current drawing device coupled to a first terminal of a first resistive load for drawing a first current through said first resistive load, said first current being related to a threshold voltage of a first transistor and a first resistance;
a second current drawing device coupled to said first terminal of said first resistive load for drawing a second current through said first resistive load, said second current being related to a threshold voltage of a second transistor and a second resistance;
said first current being changed by a first magnitude in a first direction with a change in temperature, said second current being changed by a second magnitude in a direction opposite said first direction with said change in temperature, said first and second resistances being substantially equal so that a sum of said first and second currents through said first resistive load changes with temperature inversely proportional to a change in resistance of said first resistive load;
said sum of said first and second currents through said first resistive load resulting in a substantially constant voltage across said first resistive load.

9. The circuit of claim 8 wherein said first resistive load is a variable resistor.

10. The circuit of claim 8 wherein said first current drawing device comprises a first depletion mode field effect transistor having a gate coupled to a first potential and a source coupled to said first potential through said first resistance, and wherein a drain of said first depletion mode field effect transistor is connected to said first terminal of said first resistive load.

11. The circuit of claim 10 wherein said second current drawing device comprises a second field effect transistor having its gate coupled to said first terminal of said first resistive load and also having its gate coupled to its source via said second resistance, wherein current through said second field effect transistor is controlled via a feedback means, coupled between a drain of said second field effect transistor and a second terminal of said first resistive load, which fixes a gate-source voltage across said second resistance which is dependent upon a threshold voltage of said second field effect transistor.

12. The circuit of claim 11 wherein said threshold voltage of said first depletion mode field effect transistor is different from said threshold voltage of said second field effect transistor.

13. The circuit of claim 12 wherein said feedback means comprises a second load device connected between a power supply voltage and said drain of said second field effect transistor and wherein said drain of said second field effect transistor is coupled to said second terminal of said first resistive load so that as a current is drawn through said second load device, a reduced voltage at the drain of said second field effect transistor causes a reduced voltage at the gate of said second field effect transistor, thus, restricting current flow through said second field effect transistor and causing a voltage dependent upon said threshold voltage to appear between the gate and source of said second field effect transistor.

14. The circuit of claim 13 wherein said source of said second field effect transistor is connected to said first potential via a first level shifting means.

15. The circuit of claim 14 wherein said circuit produces a reference voltage which is independent of fabrication process variations by the addition of one or more field effect transistors which are fabricated to have similar current densities as other field effect transistors in said circuit so that voltage drops across each field effect transistor are offset by similar voltage drops across said one or more field effect transistors.

16. The circuit of claim 13 wherein said feedback means further comprises a third field effect transistor having its gate coupled to said drain of said second field effect transistor and its source coupled to said second terminal of said first resistive load.

17. The circuit of claim 16 further comprising:
a fourth field effect transistor having its gate coupled to said drain of said second field effect transistor, wherein said fourth field effect transistor is fabricated to have a similar current density as said second field effect transistor in order to drop a voltage across a gate-source of said fourth field effect transistor similar to said gate-source voltage of said second field effect transistor so that a source of said fourth field effect transistor will be at a voltage which is, therefore, substantially independent of said gate-source voltage of said second and fourth field effect transistors.

18. The circuit of claim 17 further comprising a fifth field effect transistor having its gate coupled to said source of said fourth field effect transistor and having its source coupled to a second load device, wherein said third field effect transistor and said fifth field effect transistor are fabricated to have similar current densities so as to have similar gate-source voltage drops which offset one another, and so as to drop a voltage across said second load device substantially equal to said voltage across said first resistive load.

19. The circuit of claim 18 further comprising a third load device coupled between the gate of said fifth field effect transistor and said first potential.

20. The circuit of claim 19 wherein said source of said second field effect transistor is connected to said first potential via a first level shifting means, and wherein a second level shifting means is coupled between said source of said fourth field effect transistor and said gate of said fifth field effect transistor, said second level shifting means being fabricated to have a current density similar to said first level shifting means so as to drop a voltage substantially equal to the voltage dropped by said first level shifting means.

21. The circuit of claim 13 wherein said second load device comprises a sixth field effect transistor and a third resistance, wherein a drain of said sixth field effect transistor is coupled to said power supply voltage, a source of said sixth field effect transistor is coupled to a first terminal of said third resistance, and a gate of said sixth field effect transistor is coupled to a second terminal of said third resistance, said second terminal of said third resistance being coupled to said drain of said second field effect transistor, said sixth field effect transistor and said third resistance acting to generate a current which is substantially insensitive to power supply voltage fluctuations.

22. A circuit for generating a constant current reference signal over a range of temperatures comprising:
a first current drawing device coupled to a first terminal of a first resistive load for drawing a first current through said first resistive load, said first current being related to a threshold voltage of a first transistor and a first resistance;
a second current drawing device coupled to said first terminal of said first resistive load for drawing a second current through said first resistive load, said second current being related to a threshold voltage of a second transistor and a second resistance;
said first current being changed by a first magnitude in a first direction with a change in temperature, said second current being changed by a second magnitude in a direction opposite said first direction with said change in temperature, said first and second resistances being selected so that a sum of said first and second currents through said first resistive load changes with temperature in such a manner as to produce a voltage across said first resistive load which is proportional to a resistance of said first resistive load despite changes in said resistance due to temperature variations.

23. The circuit of claim 22 wherein said first resistive load is a variable resistor.

24. The circuit of claim 22 wherein said first current drawing device comprises a first depletion mode field effect transistor having a gate coupled to a first potential and a source coupled to said first potential through said first resistance, and wherein a drain of said first depletion mode field effect transistor is connected to said first terminal of said first resistive load.

25. The circuit of claim 24 wherein said second current drawing device comprises a second field effect transistor having its gate coupled to said first terminal of said first resistive load and also having its gate coupled to its source via said second resistance, wherein current through said second field effect transistor is controlled via a feedback means, coupled between a drain of said second field effect transistor and a second terminal of said first resistive load, which fixes a gate-source voltage across said second resistance which is dependent upon a threshold voltage of said second field effect transistor.

26. The circuit of claim 25 wherein said threshold voltage of said first depletion mode field effect transistor is different from said threshold voltage of said second field effect transistor.

27. The circuit of claim 26 wherein said feedback means comprises a second load device connected between a power supply voltage and said drain of said second field effect transistor and wherein said drain of said second field effect transistor is coupled to said second terminal of said first resistive load so that as a current is drawn through said second load device, a reduced voltage at the drain of said second field effect transistor causes a reduced voltage at the gate of said second field effect transistor, thus, restricting current flow through said second field effect transistor and causing a voltage dependent upon said threshold voltage to appear between the gate and source of said second field effect transistor.

28. The circuit of claim 27 wherein said source of said second field effect transistor is connected to said first potential via a first level shifting means.

29. The circuit of claim 27 wherein said circuit produces a reference voltage which is independent of fabrication process variations by the addition of one or more field effect transistors which are fabricated to have similar current densities as other field effect transistors in said circuit so that voltage drops across each field effect transistor are offset by similar voltage drops across said one or more field effect transistors.

30. The circuit of claim 27 wherein said feedback means further comprises a third field effect transistor having its gate coupled to said drain of said second field effect transistor and its source coupled to said second terminal of said first resistive load.

31. The circuit of claim 30 further comprising:
a fourth field effect transistor having its gate coupled to said drain of said second field effect transistor, wherein said fourth field effect transistor is fabricated to have a similar current density as said second field effect transistor in order to drop a voltage across a gate-source of said fourth field effect transistor similar to said gate-source voltage of said second field effect transistor so that a source of said fourth field effect transistor will be at a voltage which is, therefore, substantially independent of said gate-source voltage of said second and fourth field effect transistors.

32. The circuit of claim 31 further comprising a fifth field effect transistor having its gate coupled to said source of said fourth field effect transistor and having its source coupled to a second load device, wherein said third field effect transistor and said fifth field effect transistor are fabricated to have similar current densities so as to have similar gate-source voltage drops which offset one another so as to drop a voltage across said second load device substantially equal to said voltage across said first resistive load.

33. The circuit of claim 32 further comprising a third load device coupled between the gate of said fifth field effect transistor and said first potential.

34. The circuit of claim 33 wherein said source of said second field effect transistor is connected to said first potential via a first level shifting means, and wherein a second level shifting means is coupled between said source of said fourth field effect transistor and said gate of said fifth field effect transistor, said second level shifting means being fabricated to have a current density similar to said first level shifting means so as to drop a voltage substantially equal to the voltage dropped by said first level shifting means.

35. The circuit of claim 27 wherein said second load device comprises a sixth field effect transistor and a third resistance, wherein a drain of said sixth field effect transistor is coupled to said power supply voltage, a source of said sixth field effect transistor is coupled to a first terminal of said third resistance, and a gate of said sixth field effect transistor is coupled to a second terminal of said third resistance, said second terminal of said third resistance being coupled to said drain of said second field effect transistor, said sixth field effect transistor and said third resistance acting to generate a current which is substantially insensitive to power supply voltage fluctuations.

36. A circuit for generating a constant reference signal over a range of temperatures comprising:
- a first current drawing device comprising a first depletion mode field effect transistor having a gate coupled to a first potential and a source coupled to said first potential through a first resistance, and wherein a drain of said first depletion mode field effect transistor is connected to a first terminal of a first resistive load for drawing a first current through said first resistive load, said first current being related to a threshold voltage of said first depletion mode field effect transistor and said first resistance;
- a second current drawing device comprising a second field effect transistor having its gate coupled to said first terminal of said first resistive load and also having its gate coupled to its source via a second resistance, said second current drawing device for drawing a second current through said first resistive load, said second current being related to a threshold voltage of said second field effect transistor and said second resistance;
- a feedback means for controlling current through said second field effect transistor and for fixing a voltage across said second resistance to said threshold voltage of said second field effect transistor, said feedback means comprising a third field effect transistor having its source coupled to a drain of said second field effect transistor, a gate of said third field effect transistor being coupled to a second terminal of said first resistive load, a drain of said third field effect transistor being coupled to a power supply voltage via a second load device, and where said drain of said third field effect transistor is coupled to its gate via a third load device so that as current is drawn through said second load device, a reduced voltage at said drain of said third field effect transistor causes a reduced voltage at said gate of said third field effect transistor, thus, causing a reduced voltage to appear at said gate of said second field effect transistor and, thus, causing a voltage dependent upon said threshold voltage to appear between the gate and source of said second field effect transistor, said constant reference signal being generated at said drain of said second field effect transistor;

said first current being changed by a first magnitude in a first direction with a change in temperature, said second current being changed by a second magnitude in a direction opposite said first direction with said change in temperature, said first and second resistances being chosen so that a sum of said first and second currents through said first resistive load changes with temperature in a selected manner, said sum of said first and second currents through said first resistive load resulting in a voltage across said first resistive load and a potential at said drain of said second field effect transistor to change with temperature in a selected manner.

37. The circuit of claim 36 wherein said first resistive load is a variable resistor.

38. The circuit of claim 36 wherein said third load device is a diode.

39. The circuit of claim 36 wherein said first and second resistances are made substantially equal so that said sum of said first and second currents through said first resistive load results in a substantially constant voltage across said first resistive load despite changes in temperature.

* * * * *

REEXAMINATION CERTIFICATE (1865th)
United States Patent [19]
Fitzpatrick et al.

[11] B1 4,970,415
[45] Certificate Issued Dec. 1, 1992

[54] CIRCUIT FOR GENERATING REFERENCE VOLTAGES AND REFERENCE CURRENTS

[75] Inventors: Mark E. Fitzpatrick, San Jose; Michael G. France, Newark, both of Calif.

[73] Assignee: Gazelle Microcircuits, Inc., Santa Clara, Calif.

Reexamination Request:
No. 90/002,586, Feb. 10, 1992

Reexamination Certificate for:
Patent No.: 4,970,415
Issued: Nov. 13, 1990
Appl. No.: 381,629
Filed: Jul. 18, 1989

[51] Int. Cl.[5] .................. H03K 3/013; H03K 17/16; G05F 1/56; H02H 3/22
[52] U.S. Cl. ........................... 307/448; 307/296.1; 307/296.8; 307/310; 323/313; 361/56
[58] Field of Search ........... 307/475, 491, 310, 296.6, 307/296.8, 448; 323/907 DIG., 312, 313; 361/56

[56] References Cited
U.S. PATENT DOCUMENTS

| | | | |
|---|---|---|---|
| 3,899,693 | 8/1975 | Gaudreaut | 323/907 |
| 3,975,649 | 8/1976 | Kawagoe et al. | 307/304 |
| 4,346,344 | 8/1982 | Blauschild | 323/907 |
| 4,460,865 | 7/1984 | Bynum et al. | 323/907 |

Primary Examiner—John S. Heyman

[57] ABSTRACT

In one embodiment, a semiconductor device which generates a substantially constant reference voltage over a broad temperature range upon application of a power supply voltage thereto, wherein a current substantially inversely proportional to the value of a load resistor is drawn through the resistor to generate a substantially constant voltage across the resistor. The current through the resistor is the sum of a first current and a second current. The first current is determined by the absolute value of the threshold voltage of a depletion mode FET (DFET) in conjunction with an associated first resistor. The second current is determined by the threshold voltage of an enhancement mode FET (EFET) in conjunction with an associated second resistor. As the temperature of the device changes the first and second currents will change in opposite directions with the sum being changed inversely proportional to the change in resistance with temperature of the load resistor. As a result, the voltage across the load resistor will remain substantially constant.

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 36-39 is confirmed.

Claims 1,5,8,10,22 and 24 are determined to be patentable as amended.

Claims 2-4,6,7,9,11-21, 23,25-35, dependent on an amended claim, are determined to be patentable.

1. A circuit for generating a voltage selectively affected by temperature across a first load comprising:
   a first current drawing device coupled to a first terminal of said first load for drawing a first current through said first load, said first current being related to a threshold voltage of a first transistor; *and*
   a second current drawing device coupled to said first terminal of said first load for drawing a second current through said first load, said second current being related to a threshold voltage of a second transistor, *said second current being dependent upon said threshold voltage of said second transistor by said second current not flowing through said second transistor;*
   said first current being changed by a first magnitude in a first direction with a change in temperature, said second current being changed by a second magnitude in a direction opposite said first direction with said change in temperature.

5. [The circuit of claim 3] *A circuit for generating a voltage selectively affected by temperature across a first resistive load comprising:*
   *a first current drawing device coupled to a first terminal of said first resistive load for drawing a first current through said first resistive load, said first current being related to a threshold voltage of a first transistor; and*
   *a second current drawing device coupled to said first terminal of said first resistive load for drawing a second current through said first resistive load, said second current being related to a threshold voltage of a second transistor;*
   *said first current being changed by a first magnitude in a first direction with a change in temperature, said second current being changed by a second magnitude in a direction opposite said first direction with said change in temperature;*
   wherein said first current drawing device comprises a first depletion mode field effect transistor having a gate coupled to a first potential and a source coupled to said first potential through said first resistance, and wherein a drain of said first depletion mode field effect transistor is connected to a first terminal of said first resistive load.

8. A circuit for generating a constant voltage reference signal over a range of temperatures comprising:
   a first current drawing device coupled to a first terminal of a first resistive load for drawing a first current through said first resistive load, said first current being related to a threshold voltage of a first transistor and a first resistance;
   a second current drawing device coupled to said first terminal of said first resistive load for drawing a second current through said first resistive load, said second current being related to a threshold voltage of a second transistor and a second resistance, *said second current flowing through said second resistance and being dependent upon said threshold voltage of said second transistor by said second current not flowing through said second transistor;*
   said first current being changed by a first magnitude in a first direction with a change in temperature, said second current being changed by a second magnitude in a direction opposite said first direction with said change in temperature, said first and second resistances being substantially equal so that a sum of said first and second currents through said first resistive load changes with temperature inversely proportional to a change in resistance of said first resistive load;
   said sum of said first and second currents through said first resistive load resulting in a substantially constant voltage across said first resistive load.

10. [The circuit of claim 8] *A circuit for generating a constant voltage reference signal over a range of temperatures comprising:*
   *a first current drawing device coupled to a first terminal of a first resistive load for drawing a first current through said first resistive load, said first current being related to a threshold voltage of a first transistor and a first resistance; and*
   *a second current drawing device coupled to said first terminal of said first resistive load for drawing a second current through said first resistive load, said second current being related to a threshold voltage of a second transistor and a second resistance;*
   *said first current being changed by a first magnitude in a first direction with a change in temperature, said second current being changed by a second magnitude in a direction opposite said first direction with said change in temperature, said first and second resistances being substantially equal so that a sum of said first and second currents through said first resistive load changes with temperature inversely proportional to a change in resistance of said first resistive load;*
   *said sum of said first and second currents through said first resistive load resulting in a substantially constant voltage across said first resistive load;*
   wherein said first current drawing device comprises a first depletion mode field effect transistor having a gate coupled to a first potential and a source coupled to said first potential through said first resistance, and wherein a drain of said first depletion mode field effect transistor is connected to said first terminal of said first resistive load.

22. A circuit for generating a constant current reference signal over a range of temperatures comprising:
   a first current drawing device coupled to a first terminal of a first resistive load for drawing a first current through said first resistive load, said first current being related to a threshold voltage of a first transistor and a first resistance;

a second current drawing device coupled to said first terminal of said first resistive load for drawing a second current through said first resistive load, said second current being related to a threshold voltage of a second transistor and a second resistance, *said second current flowing through said second resistance and being dependent upon said threshold voltage of said second transistor by said second current not flowing through said second transistor;* said first current being changed by a first magnitude in a first direction with a change in temperature, said second current being changed by a second magnitude in a direction opposite said first direction with said change in temperature, said first and second resistances being selected so that a sum of said first and second currents through said first resistive load changes with temperature in such a manner as to produce a voltage across said first resistive load which is proportional to a resistance of said first resistive load despite changes in said resistance due to temperature variations.

24. [The circuit of claim 22] *A circuit for generating a constant current reference signal over a range of temperatures comprising:*

*a first current drawing device coupled to a first terminal of a first resistive load for drawing a first current through said first resistive load, said first current being related to a threshold voltage of a first transistor and a first resistance; and*

*a second current drawing device coupled to said first terminal of said first resistive load for drawing a second current through said first resistive load, said second current being related to a threshold voltage of a second transistor and a second resistance;*

*said first current being changed by a first magnitude in a first direction with a change in temperature, said second current being changed by a second magnitude in a direction opposite said first direction with said change in temperature, said first and second resistances being selected so that a sum of said first and second currents through said first resistive load changes with temperature in such a manner as to produce a voltage across said first resistive load which is proportional to a resistance of said first resistive load despite changes in said resistance due to temperature variations;* wherein said first current drawing device comprises a first depletion mode field effect transistor having a gate coupled to a first potential and a source coupled to said first potential through said first resistance, and wherein a drain of said first depletion mode field effect transistor is connected to said first terminal of said first resistive load.

* * * * *